United States Patent
Tsujimura et al.

(10) Patent No.: US 9,142,411 B2
(45) Date of Patent: Sep. 22, 2015

(54) METHOD FOR PRODUCING SEMICONDUCTOR DEVICE

(71) Applicants: Masatoshi Tsujimura, Toyota (JP);
Hirokazu Fujiwara, Miyoshi (JP);
Tomoo Morino, Anjo (JP); Narumasa Soejima, Seto (JP)

(72) Inventors: Masatoshi Tsujimura, Toyota (JP);
Hirokazu Fujiwara, Miyoshi (JP);
Tomoo Morino, Anjo (JP); Narumasa Soejima, Seto (JP)

(73) Assignee: Toyota Jidosha Kabushiki Kaisha, Toyota-Shi (JP)

( * ) Notice: Subject to any disclaimer, the term of this patent is extended or adjusted under 35 U.S.C. 154(b) by 11 days.

(21) Appl. No.: 14/090,424

(22) Filed: Nov. 26, 2013

(65) Prior Publication Data

US 2014/0162443 A1    Jun. 12, 2014

(30) Foreign Application Priority Data

Nov. 30, 2012  (JP) .................................. 2012-263471

(51) Int. Cl.
| | | |
|---|---|---|
| H01L 21/00 | (2006.01) | |
| H01L 21/04 | (2006.01) | |
| H01L 21/673 | (2006.01) | |
| H01L 29/16 | (2006.01) | |

(52) U.S. Cl.
CPC ........ *H01L 21/046* (2013.01); *H01L 21/67303* (2013.01); *H01L 29/1608* (2013.01)

(58) Field of Classification Search
CPC ................ H01L 21/268; H01L 21/046; H01L 21/67303
USPC .......................................... 438/795, 799, 931
See application file for complete search history.

(56) References Cited

U.S. PATENT DOCUMENTS

| | | | |
|---|---|---|---|
| 2008/0057713 A1* | 3/2008 | Desai et al. ................... | 438/691 |
| 2009/0269908 A1 | 10/2009 | Fujiwara et al. | |
| 2012/0184113 A1* | 7/2012 | Inoue et al. ................... | 438/799 |

FOREIGN PATENT DOCUMENTS

| | | |
|---|---|---|
| JP | 2009-266969 A | 11/2009 |
| JP | 2011-023508 A | 2/2011 |

* cited by examiner

*Primary Examiner* — Bradley K Smith
(74) *Attorney, Agent, or Firm* — Kenyon & Kenyon LLP (57) ABSTRACT

A method for producing a semiconductor device includes: an arranging process of arranging a plurality of silicon carbide wafers having opposed first and surfaces so that the first surface and the second surface of adjacent silicon carbide wafers face each other and are separated in parallel; and a heat treatment process of heating the arranged plurality of silicon carbide wafers so that the first surface of each silicon carbide wafer becomes higher in temperature than the second surface thereof, and, in the adjacent silicon carbide wafers, the second surface of one silicon carbide wafer becomes higher in temperature than the first surface of the other silicon carbide wafer that faces the second surface.

13 Claims, 4 Drawing Sheets

METHOD FOR PRODUCING SEMICONDUCTOR DEVICE

INCORPORATION BY REFERENCE

The disclosure of Japanese Patent Application No. 2012-263471 filed on Nov. 30, 2012 including the specification, drawings and abstract is incorporated herein by reference in its entirety.

BACKGROUND OF THE INVENTION

1. Field of the Invention

The present invention relates to a method for producing a semiconductor device.

2. Description of Related Art

When a semiconductor device that uses silicon carbide as, a semiconductor material is produced, a silicon carbide wafer may be heat treated. For example, after a conductive impurity was introduced in the silicon carbide wafer, an annealing treatment is conducted to activate the introduced conductive impurity. When the silicon carbide wafer is heat treated, there may be a problem that Si in the silicon carbide wafer sublimes to roughen a surface, or a concentration of conductive impurity on a wafer surface (hereinafter, simply referred to also as "impurity concentration") is degraded. In particular, in the annealing treatment to activate the conductive impurity, the silicon carbide wafer is heat treated at high temperatures such as 1500° C. to 1900° C., therefore, the above-described problem becomes remarkable. In this connection, Japanese Patent Application Publication No. 2009-266969 (JP 2009-266969 A) discloses a technology where the annealing treatment is performed after a cap layer has been formed on a surface of a silicon carbide substrate. The cap layer has a melting point higher than a temperature of the annealing treatment and is formed of metal carbide that is oxidized at 1000° C. or less. Further, the annealing treatment is performed under deoxidation atmosphere.

According to the technology of JP 2009-266969 A, the surface of the silicon carbide substrate is protected by the cap layer. In addition, since the annealing treatment is performed under the deoxidation atmosphere, even when an oxidation start temperature of the metal carbide that forms the cap layer is lower than a temperature of the annealing treatment, the cap layer can be hindered from being oxidized. Therefore, it is said that the problem that the surface of the silicon carbide substrate is roughened by the annealing treatment or an impurity concentration is degraded can be hindered from occurring. In addition, it is said that since the cap layer is oxidized at 1000° C. or less to be brittle, when an oxidizing treatment is performed at a predetermined temperature after the annealing treatment, the cap layer can be readily removed.

In the technology of JP 2009-266969 A, the steps of forming and removing the cap layer are added to the producing step of the semiconductor device. As the result, the production efficiency of semiconductor devices may be degraded or the production cost may increase. Further, it is said that the cap layer becomes brittle by oxidation and can be readily removed. However, depending on removing methods, it cannot be denied that residues of the cap layer may remain. When the residue of the cap layer remains on a surface of the silicon carbide substrate, properties of the semiconductor device may be adversely affected.

SUMMARY OF THE INVENTION

The present invention provides a technology that, in the process of heat treatment of the semiconductor device, hinders Si atoms from being removed from a surface of the silicon carbide wafer (hereinafter, simply referred to also as a wafer) to roughen a surface of the wafer, and improves production efficiency of semiconductor devices.

A first aspect of the invention relates to a method for producing a semiconductor device, which includes an arranging process and a heat treatment process. According to the producing method, in the arranging process, a plurality of silicon carbide wafers which have opposed first and second surfaces is arranged so that the first surface and the second surface of adjacent silicon carbide wafers face with each other and are separated in parallel. In the heat treatment process, the arranged plurality of silicon carbide wafers is heated so that the first surface of each silicon carbide wafer may be a temperature higher than the second surface of the each silicon carbide wafer, and in adjacent silicon carbide wafers, the second surface of one silicon carbide wafer may be a temperature higher than the first surface of the other silicon carbide wafer that faces the second surface of the one silicon carbide wafer.

In the method for producing, that is, the silicon carbide wafers are arranged so that directions of the first surfaces of all the silicon carbide wafers may be the same direction and directions of second surfaces of all the silicon carbide wafers may be the same direction. In addition, among the plurality of silicon carbide wafers, the wafers are heated so that a temperature becomes lower from the second surface of the wafer located at one end toward the first surface of the wafer located on the other end. In general, as a temperature is higher, Si atoms of the silicon carbide wafer tend to sublime from the wafer surface. According to the above method, in the adjacent silicon carbide wafers, the second surface of one wafer has a temperature higher than that of the first surface of the other wafer, therefore, Si atoms preferentially sublime from the second surface of one wafer. When Si atoms are removed from the wafer surface, a concentration of silicon atoms in a space between the adjacent silicon carbide wafers becomes higher, and Si atoms are hindered from subliming from the first surface of the other wafer thereby. Therefore, Si atoms are hindered from being removed from the first surface of the other wafer that faces one wafer to roughen the first surface of the wafer. In addition, according to the method for producing a semiconductor device, in the heat treatment process, a plurality of silicon carbide wafers is simultaneously heated. Therefore, the production efficiency of semiconductor devices can be improved. When the plurality of silicon carbide wafers is heated so that a temperature difference may be generated between the adjacent wafers, one surface of the wafer can be hindered from being roughened, and the production efficiency of semiconductor devices can be improved.

BRIEF DESCRIPTION OF THE DRAWINGS

Features, advantages, and technical and industrial significance of exemplary embodiments of the invention will be described below with reference to the accompanying drawings, in which like numerals denote like elements, and wherein.

DETAILED DESCRIPTION OF EMBODIMENTS

Technical principles described below are respectively independent from each other, and singularly or in various combinations thereof, technical usefulness can be exerted.

A method for producing a semiconductor device of the embodiment of the present invention may include, prior to the arranging process, the introducing process of introducing a conductive impurity in the first surface of the silicon carbide wafer. In addition, in the heat treatment process, an annealing treatment for activating the conductive impurity introduced in the introducing process may be performed. According to the method, upon annealing, the first surface of the silicon carbide wafer in which the conductive impurity was introduced can be properly hindered from being surface-roughened.

In the method for producing a semiconductor device, the heat treatment process may include the process of preheating, the process of putting, and the process of taking out. According to the process of preheating, the inside of a furnace may be heated in advance with a temperature gradient so that in a height direction of the furnace a temperature is high at one end of the finance and becomes lower toward the other end of the finance. In the process of putting, inside the heated furnace, a plurality of silicon carbide wafers arranged in the arranging process may be put so that the first surface of each silicon carbide wafer may be higher in temperature than the second surface thereof. In the process of taking out, the plurality of silicon carbide wafers heated inside the furnace may be taken out from the inside of the furnace. According to the method, since the inside of the furnace is heated in advance in the process of preheating, the silicon carbide wafers put in the process of pitting can be rapidly heated to a temperature necessary for heat treatment. In addition, by taking out the silicon carbide wafers from the inside of the furnace in the process of taking out, the silicon carbide wafers can be rapidly cooled. That is, the process of preheating and the process of taking out can shorten a time for heating and cooling the silicon carbide wafers. In general, when the time for heating and cooling becomes longer, Si atoms and conductive impurity are removed from a wafer surface, a wafer surface may be roughened or an impurity concentration of a wafer surface layer may be degraded. However, according to the above method, a surface of the silicon carbide wafer can be hindered from being roughened, and the impurity concentration in a wafer surface layer can be hindered from degrading.

According to the method for producing a semiconductor device, in the arranging process, at one end of the plurality of silicon carbide wafers, a dummy wafer in which the conductive impurity was not introduced is disposed, and the first surface of the silicon carbide wafer adjacent to the dummy wafer may face with the dummy wafer. According to the method, since one end, that is, the dummy wafer located on the most high temperature side has a temperature higher than the first surface of the silicon carbide wafer that faces the dummy wafer, Si atoms are preferentially removed from the surface of the dummy wafer. Therefore, Si atoms are hindered from being removed from the first surface of the silicon carbide wafer that faces the dummy wafer, and the first surface of the wafer can be hindered from being roughened.

According to the method for producing a semiconductor device, in the heat treatment process, the separated distances between adjacent silicon carbide wafers may be narrower from a high temperature side toward a low temperature side. In general, the higher the temperature is, the more readily Si atoms tend to be removed from a surface of the silicon carbide wafer. Therefore, Si atoms tend to be removed more readily from the second surface of the wafer located on a higher temperature side than from the second surface of the wafer located on a lower temperature side. Therefore, when the separated distances of the plurality of silicon carbide wafers are the same, Si atoms tend to be hindered from being removed from the first surface of the wafer located on a higher temperature side than from the first surface of the wafer located on a lower temperature side. That is, the surface roughening can be readily hindered. In this connection, by making the separated distance between adjacent wafers narrower from a high temperature side toward a low temperature side, a concentration of Si atoms in a space between adjacent wafers located on a low temperature side may be controlled substantially the same as the concentration of Si atoms in a space between adjacent wafers located on a high temperature side. By doing like this, the first surface of the wafer on a low temperature side and the first surface of the wafer on a high temperature side can be hindered from fluctuating in a degree of hindrance of the surface roughening.

According to a method for producing a semiconductor device, the first surface may be a Si surface, and the second surface may be a C surface. In general, a bonding force between Si atoms and C atoms in the C surface is weaker than that between Si atoms and C atoms in the Si surface. Therefore, by using the second surface (that is, a surface on a high temperature side between facing wafers) as the C surface, compared with the case where the second surface is taken as the Si surface, Si atoms can be readily removed from the second surface of the wafer. Simultaneously therewith, Si atoms become difficult to be removed from the first surface. Therefore, the first surface of the silicon carbide wafer can be more surely hindered from being roughened.

Since a method for forming an electrode and a protective film to the silicon carbide wafer is a well-known method, description of these methods are omitted from describing. In the present examples, by performing the forming process of forming an epitaxial growth layer, the introducing process, the arranging process, and the heat treatment process with respect to a raw material wafer 12, a semiconductor device is produced. Hereinafter, after describing structures of a susceptor 22 and a furnace 30, a method for producing a semiconductor device will be described.

Figure 4:
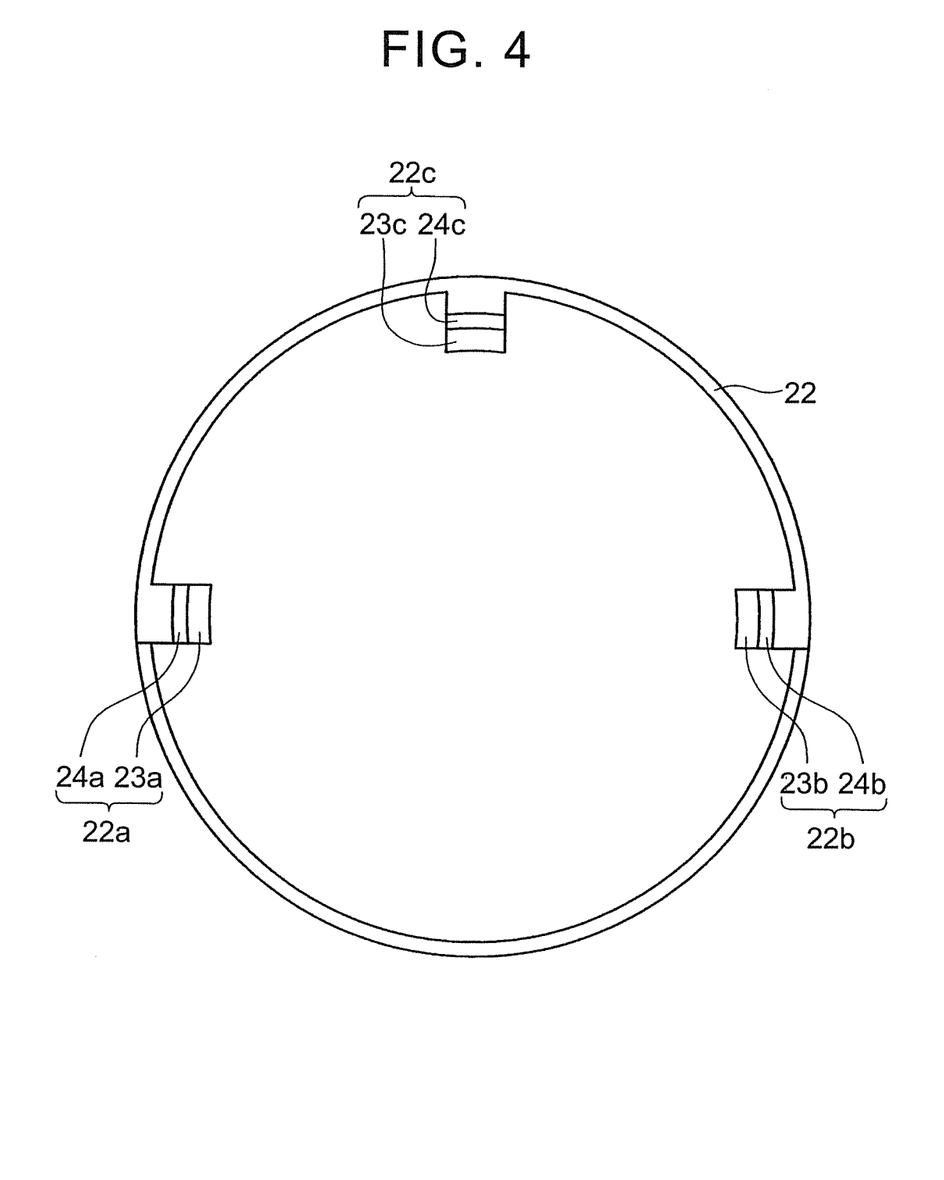
FIG. 4 shows a plan view of a susceptor.
Figure 5:
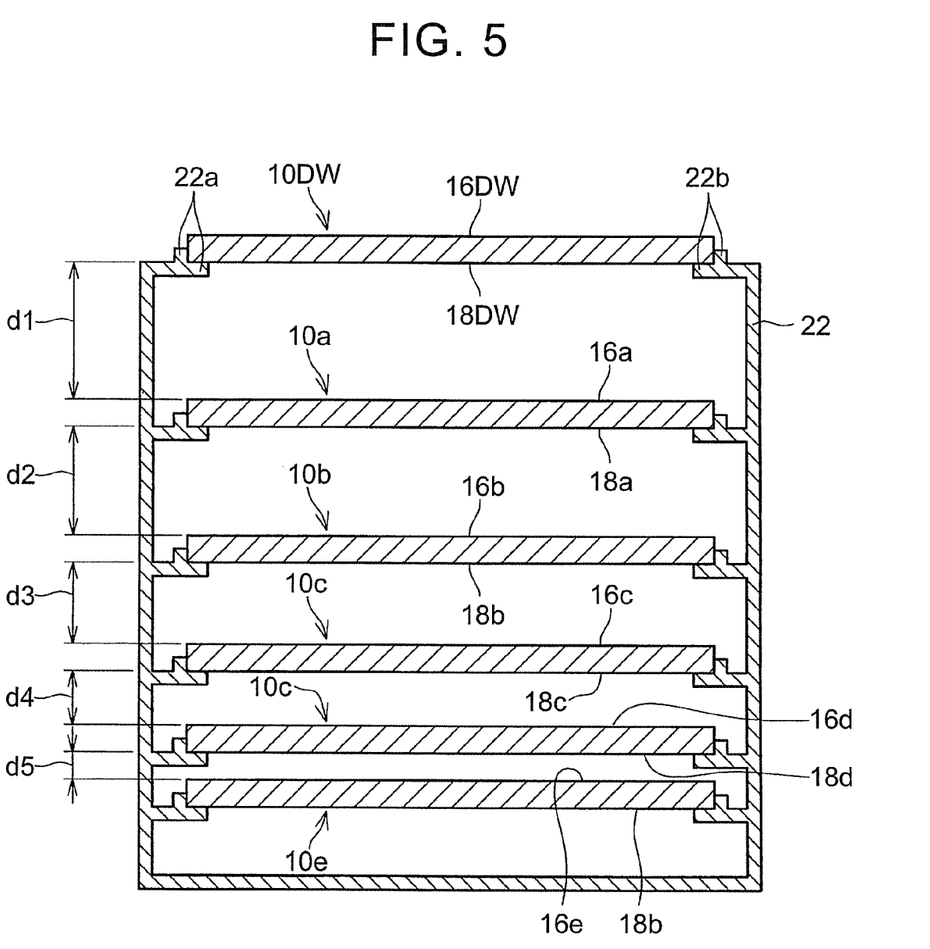
FIG. 5 shows a cross-sectional view of a susceptor on which silicon carbide wafers are arranged.

Firstly, a structure of the susceptor 22 will be described. FIG. 4 is a plan view of the susceptor 22, and FIG. 5 is a vertical cross sectional view of a state where six sheets of silicon carbide wafers 10 are arranged on the susceptor 22. The susceptor 22 is a bottomed cylindrical container having no cap, and a part of a side surface of the container is formed openable/closable. In the example, of two arcs from a support part 22a (described below) to a support part 22b, a side surface formed along an arc on a side that does not contain a support part 22c is formed openable/closable. A set of support parts 22a to 22c shown in FIG. 4 is formed on the uppermost surface of the susceptor 22. In the example, the support parts 22a and 22b are disposed at positions separated by 180° in a circumferential direction with respect to a shaft center of the susceptor 22, and the support part 22c is formed at a position that is an intermediate in a circumferential direction of the support part 22a and the support part 22b.

Shapes of the support parts 22a to 22c will be described. The support part 22a includes a pedestal 23a that is orthogonal to a side surface of the susceptor 22 and extends inward of the susceptor 22, and a protrusion plate 24a protruding upward from the pedestal 23a. That is, as shown in FIG. 5, a shape of a vertical cross section of the support part 22a is formed in a substantial T-character shape. Also the support parts 22b and 22c have the same shape. When the silicon carbide wafer 10 is disposed on the support parts 22a to 22c, a part of a side surface of the disc-like silicon carbide wafer 10 and a part of a lower surface 18 abut on the pedestals 23a to 23c of the support parts 22a to 22c having roughly inverted T character shape and protruded plates 24a to 24c, and the silicon carbide wafer 10 is supported by the support parts 22a to 22c. Incidentally, in the example, silicon carbide wafers 10a to 10e and a dummy wafer 10DW as a whole are generically called as silicon carbide wafer 10. Accompanying this, upper surfaces 16 and lower surfaces 18 of the silicon carbide wafers 10a to 10e and the dummy wafer 10DW respectively are generically called as upper surfaces 16 and lower surfaces 18. Six sets of the support parts 22a to 22c like this are formed on a side surface of the susceptor 22 with a distance in a height direction. The pedestals 23a to 23c of each set of the support parts 22a to 22c are formed in parallel with a bottom surface of the susceptor 22. A distance between each set of support parts 22a to 22c adjacent in a height direction becomes narrower from an upper part of the susceptor 22 toward the lower part thereof.

Figure 6:
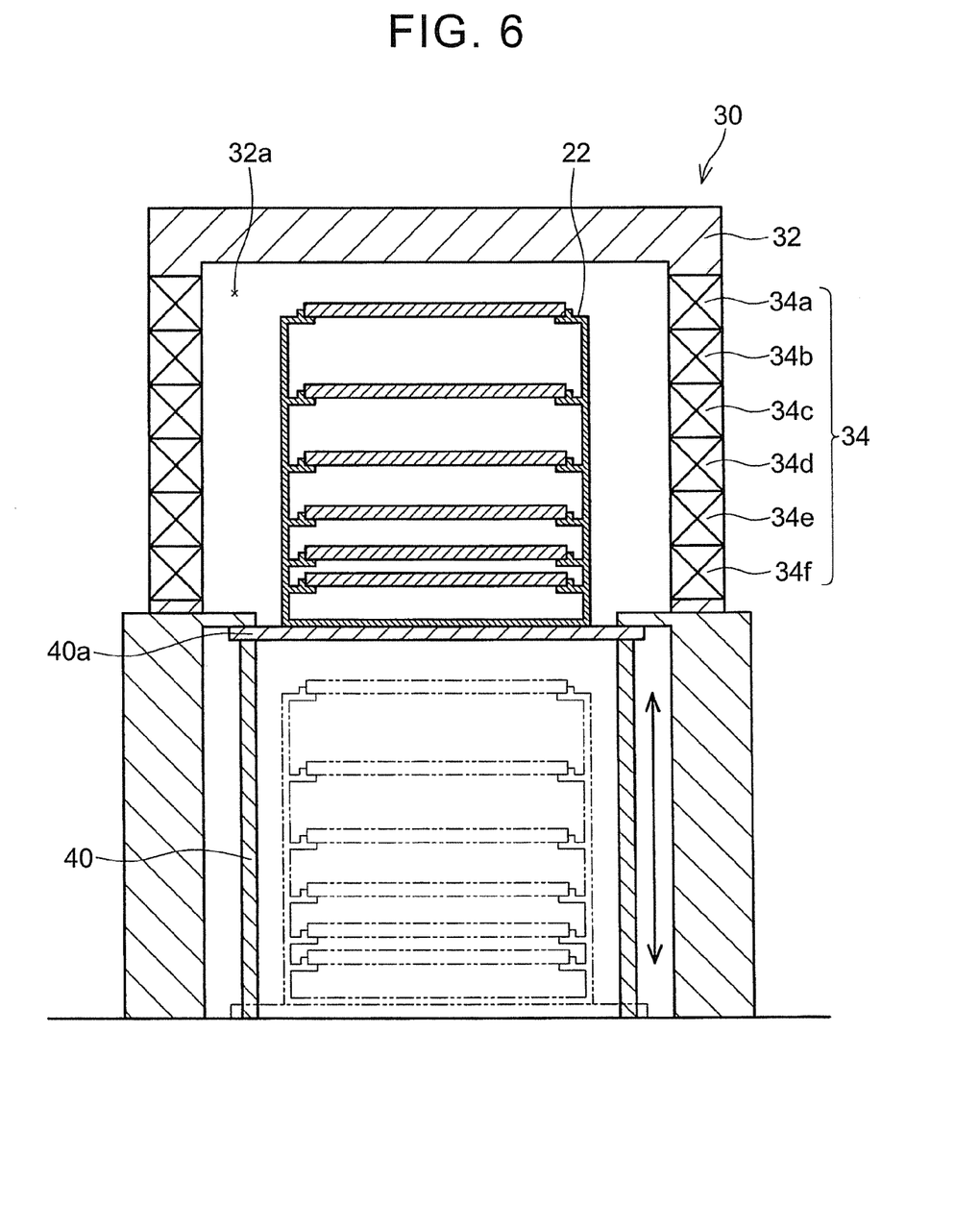
FIG. 6 is a cross-sectional view of the inside of a furnace in which a susceptor arranged with silicon carbide wafers is disposed.

Next, a structure of the furnace 30 will be described. FIG. 6 is a cross sectional view of the furnace 30 and shows a state where the susceptor 22 on which the silicon carbide wafers 10 are arranged is put in the furnace. The furnace 30 includes a furnace body 32 and a lifting device 40. The furnace body 32 is formed in cylinder with an opened lower end, and a housing space 32a is formed inside thereof. In the housing space 32a, the susceptor 22 on which the silicon carbide wafers 10 are arranged can be housed. On a side surface of the furnace body 32, a heater 34 is disposed. The heater 34 includes heaters 34a to 34f, and each of the heaters 34a to 34f can be independently controlled by a controller (not shown in the drawing).

The lifting device 40 includes a plane table 40a and a lifting mechanism (not shown in the drawing) that lifts the plane table 40a. When the plane table 40a is lifted to an upper end position (position shown by a real line in FIG. 6) by the lifting mechanism, an upper surface of the plane table 40a abuts on a lower surface of the furnace body 32 to close the lower end of the furnace body 32. The lower end of the housing space 32a is closed thereby. When the plane table 40a is lowered to the lower end position. (position shown with a two dot chain line of FIG. 6) by the lifting device, the lower end of the furnace body 32 is opened and the lower end of the housing space 32a is opened. As the lifting mechanism for lifting the plane table 40a, known various mechanisms can be used. For example, a pantagraph type lifting mechanism can be used.

Figure 1:
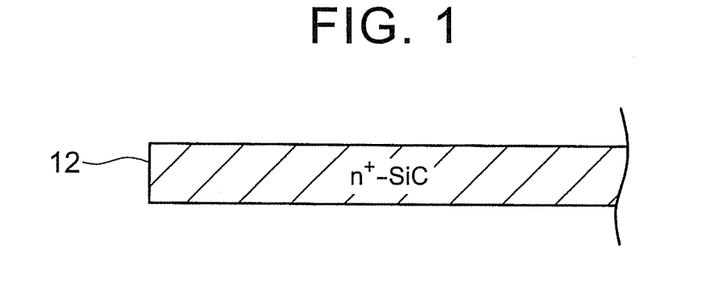
FIG. 1 shows a method for producing a semiconductor device of an example.
Figure 2:
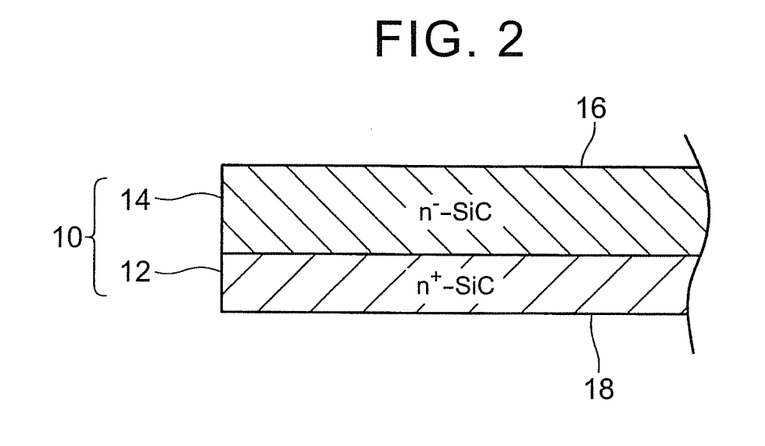
FIG. 2 shows a method for producing a semiconductor device of an example.

(Step for forming epitaxial growth layer) Next, a method for producing a semiconductor device will be described. Firstly, as shown in FIG. 1, an n-type raw material wafer 12 is prepared. The raw material wafer 12 is a disc-like wafer made of single crystal silicon carbide (SiC) and becomes a contact layer when a semiconductor device is completed. Next, as shown in FIG. 2, the raw material wafer 12 is crystal grown to form an epitaxial growth layer 14. When the epitaxial growth layer 14 is formed, nitrogen that is an n-type impurity is included at a predetermined concentration. The epitaxial growth layer 14 becomes a drift layer when the semiconductor device is completed. Hereinafter, a wafer obtained by forming the epitaxial growth layer 14 on the raw material wafer 12 is referred to as a silicon carbide wafer 10. An upper surface 16 (that is, a surface where the epitaxial growth layer 14 is formed) of the silicon carbide wafer 10 corresponds to an example of "the first surface", and a lower surface 18 that is a back surface of the upper surface 16 corresponds to an example of "the second surface". Here, in a wafer made of silicon carbide as a raw material, depending on the crystal structure of silicon carbide, there are two kinds of Si surface and C surface. In the example, on the Si surface of the raw material wafer 12, the epitaxial growth layer 14 is formed. That is, the lower surface 18 of the silicon carbide wafer 10 is a C surface, and the upper surface 16 is a new Si surface.

Figure 3:
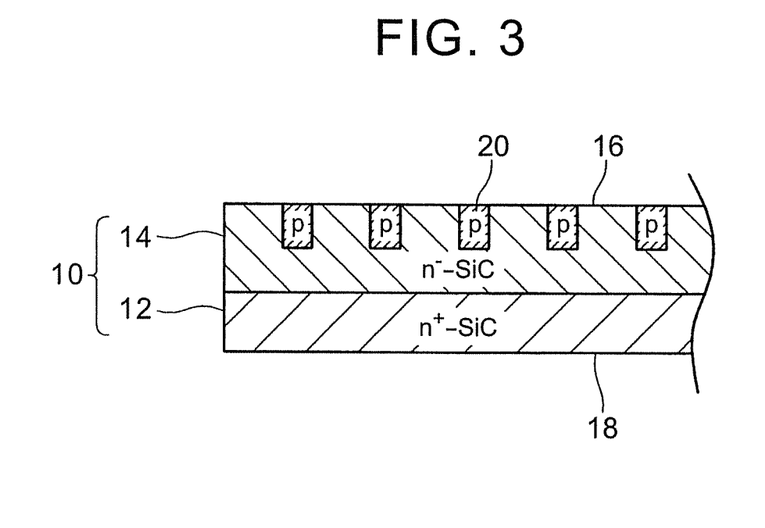
FIG. 3 shows a method for producing a semiconductor device of an example.

(Step of introducing) Subsequently, as shown in FIG. 3, aluminum that is a p-type impurity is introduced on the upper surface 16 (that is, a surface of the epitaxial growth layer 14) of the silicon carbide wafer 10 to form a p-type semiconductor region 20. The p-type impurity can be introduced by ion implantation after a mask is formed by photolithography. Aluminum corresponds to one example of "conductive impurities". In the example, the introducing process is performed on each of 5 sheets of silicon carbide wafers 10a to 10e.

(Step of arranging) Next, as shown in FIG. 5, 5 sheets of silicon carbide wafers 10a to 10e, on which a p-type semiconductor region 20 was formed are arranged on the susceptor 22. First, among a side surface of the susceptor 22, a portion formed openable is opened, on a set of support parts 22a to 22c on the second stage from the above of the susceptor 22 of FIG. 5, the silicon carbide wafer 10a is disposed. At this time, the silicon carbide wafer 10a is disposed on the support parts 22a to 22c so that the upper surface 16a thereof is directed to an upper direction (that is, upper direction of plane of paper) and the lower surface 18a thereof is directed to a lower direction (that is, lower direction of plane of paper). Subsequently, the silicon carbide wafer 10b is disposed on a set of support parts 22a to 22c on the third stage from the above of the susceptor 22. Directions of the upper surface 16b and the lower surface 18b of the silicon carbide wafer 10b are the same as those of the silicon carbide wafer 10a. Therefore, the silicon carbide wafers 10a and 10b are disposed so that the lower surface 18a of the silicon carbide wafer 10a and the upper surface 16b of the silicon carbide wafer 10b face each other in parallel with a distance d2. Hereinafter, in the same manner as that described above, the silicon carbide wafers 10c to 10e each are disposed on the support parts 22a to 22c on the forth to sixth stages from the above of the susceptor 22. When the silicon carbide wafers 10a to 10e are disposed like this, the upper surfaces 16b to 16e and the lower surfaces 18a to 18d of the adjacent silicon carbide wafers face each other and the adjacent silicon carbide wafers are separated in parallel with a predetermined distance separated. Specifically, with respect to the silicon carbide wafers 10b and 10c, the lower surface 18b and the upper surface 16c face in parallel with a distance d3 separated, with respect to the silicon carbide wafers 10c and 10d, the lower surface 18c and the upper surface 16d face in parallel with a distance d4 separated, and with respect to the silicon carbide wafers 10d and 10e, the lower surface 18d and the upper surface 16e face in parallel with a distance d5 separated.

Next, the dummy wafer 10DW is disposed to a set of support parts 22a to 22c on the first stage of the susceptor 22. The dummy wafer 10DW is produced via the same processes as the silicon carbide wafers 10a to 10e except that the introducing process of introducing the p-type impurity is not performed. That is, in the dummy wafer 10DW, aluminum that is a conductive impurity is not introduced, that is, the p-type semiconductor region 20 is not formed. The dummy wafer 10DW and the silicon carbide wafer 10a are disposed so that the lower surface 18DW of the dummy wafer 10DW and the upper surface 16a of the silicon carbide wafer 10a face in parallel with a distance d1 separated. Here, separated distances d1 to d5 between adjacent silicon carbide wafers 10 have a relationship of d1>d2>d3>d4>d5. Further, centers of each disc-like silicon carbide wafer 10 are located coaxially. In the example, after disposing the silicon carbide wafer 10a, the silicon carbide wafers 10b to 10e are disposed, and the dummy wafer 10DW was disposed at the last. However, an order of disposing the silicon carbide wafers 10 is not limited thereto. For example, an order of the dummy wafer 10DW, the silicon carbide wafers 10a, 10b, 10c, 10d, and 10e may be adopted, and 6 sheets of the silicon carbide wafers 10 may be disposed simultaneously.

(Step of heat treatment) In the process, firstly, the housing space 32a of the furnace body 32 is heated in advance with the heater 34. Specifically, in a state where nothing is disposed on the plane table 40a, the plane table 40a is elevated to an upper end position by the lifting mechanism to close a lower end of the housing space 32a. Then, using the controller, heaters 34a, 34b, 34c, 34d, 34e, and 34f respectively are controlled to 1700° C., 1680° C., 1660° C., 1640° C., 1620° C. and 1600° C. Thus, in the housing space 32a, a temperature gradient where a temperature becomes lower from the upper part toward the lower part is provided. Further, the upper part of the housing space 32a corresponds to an example of "one end", and the lower part corresponds to an example of "the other end". The number of the heaters and controlled temperatures are not limited thereto.

Next, the susceptor 22 on which the silicon carbide wafers 10 were arranged in the arranging process is introduced into the furnace. First, the plane table 40a located at the upper end position by the process of preheating is lowered to the lower end position by the lifting mechanism. Subsequently, the susceptor 22 is placed on the plane table 40a and once more lifted to the upper end position by the lifting mechanism. Thus, the lower end of the housing space 32a is closed, and in the heated housing space 32a the susceptor 22 on which the silicon carbide wafers 10 are disposed is housed. In the housing space 32a, by the process of preheating, a temperature gradient where a temperature is high in the upper part and becomes lower toward the lower part is provided. Therefore, the upper surface 16 of each of silicon carbide wafers 10 has a temperature higher than the lower surface 18 thereof. In addition, between adjacent silicon carbide wafers 10, the lower surface 18 of the silicon carbide wafer 10 located on the upper side has a temperature higher than that of the upper surface 16 of the silicon carbide wafer 10 located on the lower side. As described above, the separated distances d1 to d5 between the adjacent silicon carbide wafers 10 have a relationship of d1>d2>d3>d4>d5. Therefore, the separated distances d1 to d5 become narrower from the high temperature side toward the low temperature side of the housing space 32a.

The susceptor 22 put in the process of putting is heated inside of the furnace 30 and an annealing treatment is performed to the silicon carbide wafers 10. Thus, aluminum introduced in the silicon carbide wafers 10a to 10e in the introducing process can be activated.

After the completion of the annealing treatment, the susceptor 22 is taken out of the furnace. Specifically, the plane table 40a is lowered to the lower end position by the lifting mechanism. Then, the susceptor 22 is moved to a predetermined position from the plane table 40a. Thus, the silicon carbide wafers 10 disposed to the susceptor 22 are exposed to a normal temperature. By the processes of preheating, putting, and taking out, the heat treatment process is performed. After that, according to a conventional technology, a semiconductor device is produced. The lower surfaces 18a to 18e of the silicon carbide wafers 10a to 10e are polished by CMP (chemical mechanical polishing) or the like after completion of the heat treatment process.

Advantages of a method for producing a semiconductor device according to example 1 will be described. According to the method for producing, in the housing space 32a inside of the furnace body 32, a temperature gradient where a temperature becomes lower from the upper part toward the lower part is provided. Thus, in the adjacent silicon carbide wafers 10, the lower surface 18 of the silicon carbide wafer 10 located on the upper side has a temperature higher than that of the upper surface 16 of the silicon carbide wafer 10 located on the lower side. In general, the higher the temperature is, Si atoms of the silicon carbide wafer tend to sublime more readily from a surface of the wafer. Therefore, Si atoms preferentially sublime from the lower surface 18 of the silicon carbide wafer 10 on the upper side. When Si atoms are removed from the lower surface 18, since a concentration of Si atoms in a space between the adjacent silicon carbide wafers 10 becomes higher, Si atoms are hindered from subliming from the upper surface 16 of silicon carbide wafer 10 on the lower side. Therefore, Si atoms are hindered from being removed from the upper surface 16 of the silicon carbide wafer 10 on the lower side and the upper surface 16 is hindered from being roughened. That is, the upper surfaces 16a to 16e of the silicon carbide wafers 10a to 10e can be hindered from being surface-roughened. In particular, since the annealing treatment is performed at high temperatures, Si atoms tend to be removed from the surface of the silicon carbide wafer. However, when a configuration like this is adopted, Si atoms can be hindered from being removed and the surface can be hindered from being roughened. Further, according to the method for producing, when a temperature gradient is provided in the housing space 32a, the temperature difference can be generated between the adjacent silicon carbide wafers 10. Thus, according to the example, 5 sheets of the silicon carbide wafers 10a to 10e can be anneal treated at one time, and the production efficiency of semiconductor devices can be improved. Incidentally, according to the method for producing, since Si atoms are removed from the lower surface 18 of each of the silicon carbide wafers 10, a surface of the lower surface 18 is roughened. However, since the lower surfaces 18a to 18e of the silicon carbide wafers 10a to 10e are polished in the later process, there is no particular problem even when the lower surface 18 is roughened in the heat treatment process.

In addition, the upper surface 16 of the silicon carbide wafer 10 is a Si surface and the lower surface 18 is a C surface. In general, a bonding force between a Si atom and a C atom in the C surface is weaker than that between a Si atom and a C atom in the Si surface. Therefore, when the C surface is set to the lower surface 18 on a high temperature side in surfaces that face of the adjacent silicon carbide wafers 10, in comparison with the case where the Si surface is set to the lower surface 18, Si atoms tend to be readily removed from the lower surface 18. On the other hand, by setting the upper surface 16 that is on a low temperature side to the Si surface, in comparison with the case where the upper surface 16 is set to the C surface, Si atoms become more difficult to be removed from the upper surface 16. Thus, the upper surfaces 16a to 16e of the silicon carbide wafers 10a to 10e (that is, surfaces in which impurity was introduced) can be more hindered from being surface-roughened.

Further, according to the method for producing, in the process of preheating of the heat treatment process, the housing space 32a of the furnace body 32 is heated in advance. Therefore, in comparison with the case where after the silicon carbide wafers 10 were put, a temperature inside of the furnace body is elevated, the silicon carbide wafers 10 can be rapidly heated up to a temperature necessary for annealing treatment. Further, in the process of taking out, for every susceptor 22, annealed silicon carbide wafers 10 are taken out of the inside of the furnace and exposed to normal temperature. Therefore, in comparison with the case where, after completion of the annealing treatment, a temperature inside of the furnace body is lowered and the silicon carbide wafers 10 are taken out, the silicon carbide wafers 10 can be rapidly cooled. In general, as a heating/cooling time becomes longer, the impurity is removed from the surface in which the impurity was introduced to reduce the impurity concentration of the silicon carbide wafer superficial layer. Further, also Si atoms tend to be removed. However, in the example, by providing the process of preheating and the process of taking out, the heating/cooling time of the silicon carbide wafers 10 can be shortened. Thus, the impurity and Si atoms can be hindered from being removed from the upper surface 16 in which the impurity was introduced. That is, the impurity concentrations of the upper surfaces 16a to 16e of the silicon carbide wafers 10a to 10e can be hindered from degrading, and the surfaces are hindered from being roughened. According to the example, after the housing space 32a was heated in the process of preheating, the plane table 40a is once lowered. That is, after the process of preheating, the lower end of the furnace body 32 is opened. A temperature of the heated housing space 32a decreases a little bit thereby. However, compared with the case where after the silicon carbide wafers 10 were put without going through the process of preheating, a temperature rise is started, a temperature of the housing space 32a can be elevated to a temperature necessary for heat treatment in a shorter time. By taking into consideration a temperature decrease caused by opening the lower end of the furnace body 32, in the process of preheating, the housing space 32a may be heated to a temperature higher than a temperature necessary for heat treatment.

Further, according to the method for producing, on a set of the support parts 22a to 22c on the uppermost of the susceptor 22, the dummy Wafer 10DW in which the impurity was not introduced is disposed. Since the dummy wafer 10DW is disposed on the uppermost stage, in the heat treatment process, from both surfaces of the upper surface 16DW and the lower surfaces 18DW thereof, Si atoms are removed to surface-roughen the both surfaces. By disposing the dummy wafer 10DW like this on the uppermost stage, among the silicon carbide wafers 10a to 10e in which the impurity was introduced, the upper surface 16a of the silicon carbide wafer 10a located on the most high temperature side can be hindered from being surface-roughened. That is, the upper surfaces 16a to 16e of all silicon carbide Wafers 10a to 10e that underwent the introducing process can be hindered from being surface-roughened.

Further, according to the method for producing, the separated distances between adjacent silicon carbide wafers 10 become narrower from a high temperature side toward a low temperature side. In general, since the higher the temperature is, the more readily Si atoms tend to be removed from the surface of silicon carbide wafer, Si atoms tend to be removed from the lower surface 18DW of the dummy wafer 10DW than the lower surface 18d of the silicon carbide wafer 10d. Therefore, in the example, by making the separated distance between the adjacent wafers narrower from a high temperature side toward a low temperature side, a concentration of Si atoms in a space between the silicon carbide wafers 10d, 10e which are located on the low temperature side is controlled to be substantially equal as the concentration of Si atoms in a space between the dummy wafer 10DW and the silicon carbide wafer 10a which are located on a high temperature side. By doing so, between the upper surface 16e of the silicon carbide wafer 10e on a low temperature side and the upper surface 16a of the silicon carbide wafer 10a on a high temperature side, the degree of surface-roughening can be hindered from fluctuating. That is, according to the method for producing, the degree of the surface-roughening of the upper surfaces of a plurality of silicon carbide wafers can be controlled to the substantially the same degree.

In the above, examples of the invention were detailed. However, these are only illustrations, the semiconductor device and the method for producing semiconductor devices include various modifications and alterations of the above examples.

For example, in examples, the epitaxial growth layer 14 was formed on the raw material wafer 12. However, the epitaxial growth layer 14 may not be formed. Further, the heat treatment is not limited to the annealing treatment. For example, the heat treatment may be heat treatment (treatment for forming oxide film) for forming an oxide film on a surface of a silicon carbide wafer. Further, the heater 34 may be controlled so that a temperature becomes higher from the heater 34a toward 34f. In this case, a susceptor where distances of the plurality of silicon carbide wafers are set so as to expand gradually from the upper side toward the lower side is preferably used. Still further, a shape of the susceptor 22 and the number and positions of the support parts 22a to 22c can be optional as long as a plurality of silicon carbide wafers 10 can be arranged in parallel with distance. For example, the susceptor 22 may have a structure that does not have a side surface and where on the bottom surface of the susceptor 22 only pillars to which the support parts 22a to 22c are attached are formed. Still further, the number of sheets of the silicon carbide wafers arranged to the susceptor 22 may be any number of sheets as long as the heat treatment can be properly conducted and the upper surface of the wafer can be properly hindered from being surface-roughened.

In the above, specific examples of the invention were detailed. However, these are only illustrations. Specific examples illustrated in the above can be variously modified and altered.

What is claimed is:

1. A method for producing a semiconductor device comprising:
   an arranging process of arranging a plurality of silicon carbide wafers having opposed first and second surfaces so that the first surface and the second surface of adjacent silicon carbide wafers face each other and are separated in parallel;
   a heat treatment process of heating the arranged plurality of silicon carbide wafers so that the first surface of each silicon carbide wafer becomes higher in temperature than the second surface of the each silicon carbide wafer, and, in the adjacent silicon carbide wafers, the second surface of one silicon carbide wafer becomes higher in temperature than the first surface of the other silicon carbide wafer that faces the second surface of the one silicon carbide wafer, and
   an introducing process of introducing a conductive impurity on the first surface of the silicon carbide wafer before the arranging process,
   wherein the introduced conductive impurity is activated by heating the silicon carbide wafer in the heat treatment process;
   wherein among the arranged plurality of silicon carbide wafers, the silicon carbide wafer located on the most outside is a dummy wafer in which the conductive impurity was not introduced; and the first surface of the silicon carbide wafer adjacent to the dummy wafer faces the dummy wafer.

2. The method for producing according to claim 1, wherein the heat treatment process includes:

preheating an inside of a furnace with a temperature gradient where a temperature increases in a height direction of the furnace;

putting the arranged plurality of silicon carbide wafers in the inside of the heated furnace so that the first surface of the each silicon carbide wafer has a temperature higher than a temperature of the second surface of the each silicon carbide wafer; and taking out the plurality of silicon carbide wafers heated in the furnace.

3. The method for producing according to claim 1, wherein a separated distance between adjacent silicon carbide wafers becomes narrower from a high temperature side toward a low temperature side.

4. The method for producing according to claim 1, wherein the first surface is a Si surface and the second surface is a C surface.

5. The method for producing according to claim 1, wherein
the first surface is an external surface of a layer formed by epitaxial growth of the silicon carbide wafer; and
the second surface is an external surface of a raw material wafer.

6. The method for producing according to claim 1, wherein the second surface is polished.

7. A method for producing a semiconductor device comprising:

an arranging process of arranging a plurality of silicon carbide wafers having opposed first and second surfaces so that the first surface and the second surface of adjacent silicon carbide wafers face each other and are separated in parallel; and a heat treatment process of heating the arranged plurality of silicon carbide wafers so that the first surface of each silicon carbide wafer becomes higher in temperature than the second surface of the each silicon carbide wafer, and, in the adjacent silicon carbide wafers, the second surface of one silicon carbide wafer becomes higher in temperature than the first surface of the other silicon carbide wafer that faces the second surface of the one silicon carbide wafer, wherein a separated distance between adjacent silicon carbide wafers becomes narrower from a high temperature side toward a low temperature side.

8. The method for producing according to claim 7, further comprising:

an introducing process of introducing a conductive impurity on the first surface of the silicon carbide wafer before the arranging process, wherein the introduced conductive impurity is activated by heating the silicon carbide wafer in the heat treatment process.

9. The method for producing according to claim 7, wherein the heat treatment process includes:

preheating an inside of a furnace with a temperature gradient where a temperature increases in a height direction of the furnace;

putting the arranged plurality of silicon carbide wafers in the inside of the heated furnace so that the first surface of the each silicon carbide wafer has a temperature higher than a temperature of the second surface of the each silicon carbide wafer; and taking out the plurality of silicon carbide wafers heated in the furnace.

10. The method for producing according to claim 8, wherein
among the arranged plurality of silicon carbide wafers, the silicon carbide wafer located on the most outside is a dummy wafer in which the conductive impurity was not introduced; and the first surface of the silicon carbide wafer adjacent to the dummy wafer faces the dummy wafer.

11. The method for producing according to claim 7, wherein the first surface is a Si surface and the second surface is a C surface.

12. The method for producing according to claim 7, wherein
the first surface is an external surface of a layer formed by epitaxial growth of the silicon carbide wafer; and
the second surface is an external surface of a raw material wafer.

13. The method for producing according to claim 7, wherein
the second surface is polished.

* * * * *